United States Patent
Drew et al.

(10) Patent No.: US 9,646,130 B2
(45) Date of Patent: May 9, 2017

(54) VEHICLE SIMULATOR SYSTEM

(71) Applicant: Drew Technologies, Inc., Ann Arbor, MI (US)

(72) Inventors: Michael Drew, Dexter, MI (US); Brian Herron, Dexter, MI (US)

(73) Assignee: DREW TECHNOLOGIES, INC., Ann Arbor, MI (US)

( * ) Notice: Subject to any disclaimer, the term of this patent is extended or adjusted under 35 U.S.C. 154(b) by 605 days.

(21) Appl. No.: 14/132,771

(22) Filed: Dec. 18, 2013

(65) Prior Publication Data

US 2014/0172397 A1 Jun. 19, 2014

Related U.S. Application Data

(60) Provisional application No. 61/738,551, filed on Dec. 18, 2012.

(51) Int. Cl.
*G06F 17/50* (2006.01)

(52) U.S. Cl.
CPC ...... *G06F 17/5095* (2013.01); *G06F 17/5009* (2013.01)

(58) Field of Classification Search
USPC ............... 703/8, 22, 24; 702/179, 182, 183
See application file for complete search history.

(56) References Cited

U.S. PATENT DOCUMENTS

| | | | | |
|---|---|---|---|---|
| 7,260,501 B2* | 8/2007 | Pattipatti | ............ | G05B 23/0243 702/182 |
| 7,536,277 B2* | 5/2009 | Pattipatti | ............ | G05B 23/0243 702/179 |
| 8,612,107 B2* | 12/2013 | Malikopoulos | ... | B60W 30/1882 701/101 |
| 8,874,477 B2* | 10/2014 | Hoffberg | ............ | G06Q 10/0631 705/37 |
| 2006/0064291 A1* | 3/2006 | Pattipatti | ............ | G05B 23/0243 703/14 |
| 2008/0004840 A1* | 1/2008 | Pattipatti | ............ | G05B 23/0243 702/183 |
| 2013/0253782 A1* | 9/2013 | Saltsman | ............ | G01M 17/007 701/51 |

* cited by examiner

*Primary Examiner* — Thai Phan
(74) *Attorney, Agent, or Firm* — Brinks Gilson & Lione (57) ABSTRACT

A system includes a simulator device having a computing device having a computer processor and a computer readable medium. The simulator device further includes a communication port configured for communicating with an emissions inspection tool. The simulator device also has a database associated with the computing device and including multiple vehicle profiles, wherein individual ones of the multiple vehicle profiles include a plurality of Engine Control Units (ECUs), and wherein individual ones of the plurality of ECUs are configured to simulate a plurality of Parameter IDs (PIDs) and corresponding response codes. The individual ones of the multiple vehicle profiles are independently selectable for providing at least one PID response code to the vehicle inspection tool. The computing device is configured to perform a vehicle simulation for auditing a vehicle inspection tool.

24 Claims, 8 Drawing Sheets

FIG - 1

PID List Editor

| Enabled | Report | PID | Timing | Modifier | Description | Response |
|---|---|---|---|---|---|---|
| ☒ | ▣ | 1 | 0 | Static ▸ | I/M Readiness Data | 34 5c 19 12 |
| ☒ | ▣ | 2 | 0 | Static ▸ | Freeze Frame DTC | 45 23 |
| ☒ | ▣ | 3 | 0 | Static ▸ | Fuel System Status | B1 C9 |
| ☒ | ▣ | 4 | 0 | Static ▸ | Calculated LOAD Value | C4 |
| ☒ | ▣ | 5 | 0 | Static ▸ | Engine Coolant Temperature | A1 |
| ☒ | ▣ | 6 | 0 | Static ▸ | Short Term Fuel Trim - Bank 1 | C1 B2 |
| ☒ | ▣ | 7 | 0 | Static ▸ | Long Term Fuel Trim - Bank 1 | 35 C3 |
| ☒ | ▣ | 8 | 0 | Static ▸ | Short Term Fuel Trim - Bank 2 | 94 98 |
| ☒ | ▣ | 9 | 0 | Static ▸ | Long Term Fuel Trim - Bank 2 | 23 C4 |
| ☒ | ▣ | 10 | 0 | Static ▸ | Fuel Pressure (gauge) | 96 |
| ☒ | ▣ | 11 | 0 | Static ▸ | Intake Manifold Absolute Pressure | 55 |
| ☒ | ▣ | 12 | 0 | Static ▸ | Engine RPM | 01 |
| ☒ | ▣ | 13 | 0 | Static ▸ | Vehicle Speed Sensor | 90 |
| ☒ | ▣ | 14 | 0 | Static ▸ | Ignition Timing Advance #1 Cylinder | 10 |
| ☒ | ▣ | 15 | 0 | Static ▸ | Intake Air Temperature | 10 |
| ☒ | ▣ | 16 | 0 | Static ▸ | Air Flow Rate from Mass Air Flo... | 10 |
| ☒ | ▣ | 17 | 0 | Static ▸ | Absolute Throttle Position | 10 |

Add PID Manually

Cancel Changes    Save Settings

| Enabled | Report | PID | Timing | Modifier | | Description | Response |
|---|---|---|---|---|---|---|---|
| ☒ | ☒ | 0 | 0 | Static | ▶ | PID Availability Response | FF FF FF FF |
| ☒ | ☒ | 1 | 0 | Static | ▶ | I/M Readiness Data | 34 5c 19 12 |
| ☒ | ☒ | 2 | 0 | Static | ▶ | Freeze Frame DTC | 45 23 |
| ☒ | ☒ | 3 | 0 | Static | ▶ | Fuel System Status | B1 C9 |
| ☒ | ☒ | 4 | 0 | Static | ▶ | Calculated LOAD Value | C4 |
| ☒ | ☒ | 5 | 0 | Static | ▶ | Engine Coolant Temperature | A1 |
| ☒ | ☒ | 6 | 0 | Static | ▶ | Short Term Fuel Trim - Bank 1 | C1 B2 |
| ☒ | ☒ | 7 | 0 | Static | ▶ | Long Term Fuel Trim - Bank 1 | 35 C3 |
| ☒ | ☒ | 8 | 0 | Static | ▶ | Short Term Fuel Trim - Bank 2 | 94 98 |
| ☒ | ☒ | 9 | 0 | Static | ▶ | Long Term Fuel Trim - Bank 2 | 23 C4 |
| ☒ | ☒ | 10 | 0 | Static | ▶ | Fuel Pressure (gauge) | 96 |
| ☒ | ☒ | 11 | 0 | Static | ▶ | Intake Manifold Absolute Pressure | 55 |
| ☒ | ☒ | 12 | 0 | Static | ▶ | Engine RPM | 01 |
| ☒ | ☒ | 13 | 0 | Static | ▶ | Vehicle Speed Sensor | 90 |
| ☒ | ☒ | 14 | 0 | Static | ▶ | Ignition Timing Advance #1 Cylinder | 10 |
| ☒ | ☒ | 15 | 0 | Static | ▶ | Intake Air Temperature | 10 |
| ☒ | ☒ | 16 | 0 | Static | ▶ | Air Flow Rate from Mass Air Flo... | 10 |

Add PID Manually

Cancel Changes    Save Settings

VEHICLE SIMULATOR SYSTEM

CROSS REFERENCE TO RELATED PATENT APPLICATION

This application claims priority to U.S. Provisional Patent Application 61/738,551 filed on Dec. 18, 2012, which is hereby incorporated by reference in its entirety.

BACKGROUND

1. Field of the Invention

The present invention generally relates vehicle emissions interfaces.

2. Description of Related Art

From 1996-present, vehicles have onboard diagnostics which allow technicians and emissions test stations to evaluate the vehicle's condition. The vehicle's electronic control unit (ECU) was designed from the factory to continuously test its own emissions and only set the emissions monitors to "ready" once those tests have successfully completed. If the tests are not completed, or if they have failed, the monitor status is reported as "not ready".

When vehicles are brought in for state emissions, they are tested by a state-authorized facility that plugs a scantool into the vehicle's OBD-II port. When connected, the scantool checks the ECU to see if any trouble codes are present, and if all of the vehicle's emission monitors have passed. If all of the monitors have passed and no trouble codes are present, the vehicle passes the states emissions test. If any trouble codes are present or if any of the monitors have not completed their tests, the vehicle fails the state emissions test. In many states, this emissions test is required for annual or bi-annual registration.

In some emissions testing programs, the inspection tool performing the emissions testing must be regularly audited to verify proper operation. When an inspection tool is audited, normally a designated auditor visits the admissions test station and connects a vehicle simulator to the inspection tool. The vehicle simulator essentially acts like an OBD-II vehicle and allows the auditor to test several pass/fail scenarios on the inspection tool. If the inspection tool properly identifies each pass/fail scenario, the tool is certified. If the inspection tool does not properly identify each pass and fail scenario, the tool is no longer certified.

However, current vehicle simulators used for auditing have several limitations. For example, even though modern vehicles are increasingly complex with many ECU's on board, simulators currently used for testing only simulate one ECU. The simulators also have a limited number of pass/fail scenarios that must be preprogrammed prior to use and are difficult or impossible to modify in the field.

SUMMARY

A system includes a simulator device having a computing device having a computer processor and a computer readable medium. The simulator device further includes a communication port configured for communicating with an emissions inspection tool. The simulator device also has a database associated with the computing device and including multiple vehicle profiles, wherein individual ones of the multiple vehicle profiles include a plurality of Engine Control Units (ECUs), and wherein individual ones of the plurality of ECUs are configured to simulate a plurality of Parameter IDs (PIDs) and corresponding response codes. The individual ones of the multiple vehicle profiles are independently selectable for providing at least one PID response code to the vehicle inspection tool. The computing device is configured to perform a vehicle simulation for auditing a vehicle inspection tool.

Further objects, features and advantages of this invention will become readily apparent to persons skilled in the art after a review of the following description, with reference to the drawings and claims that are appended to and form a part of this specification.

DETAILED DESCRIPTION

Figure 1:
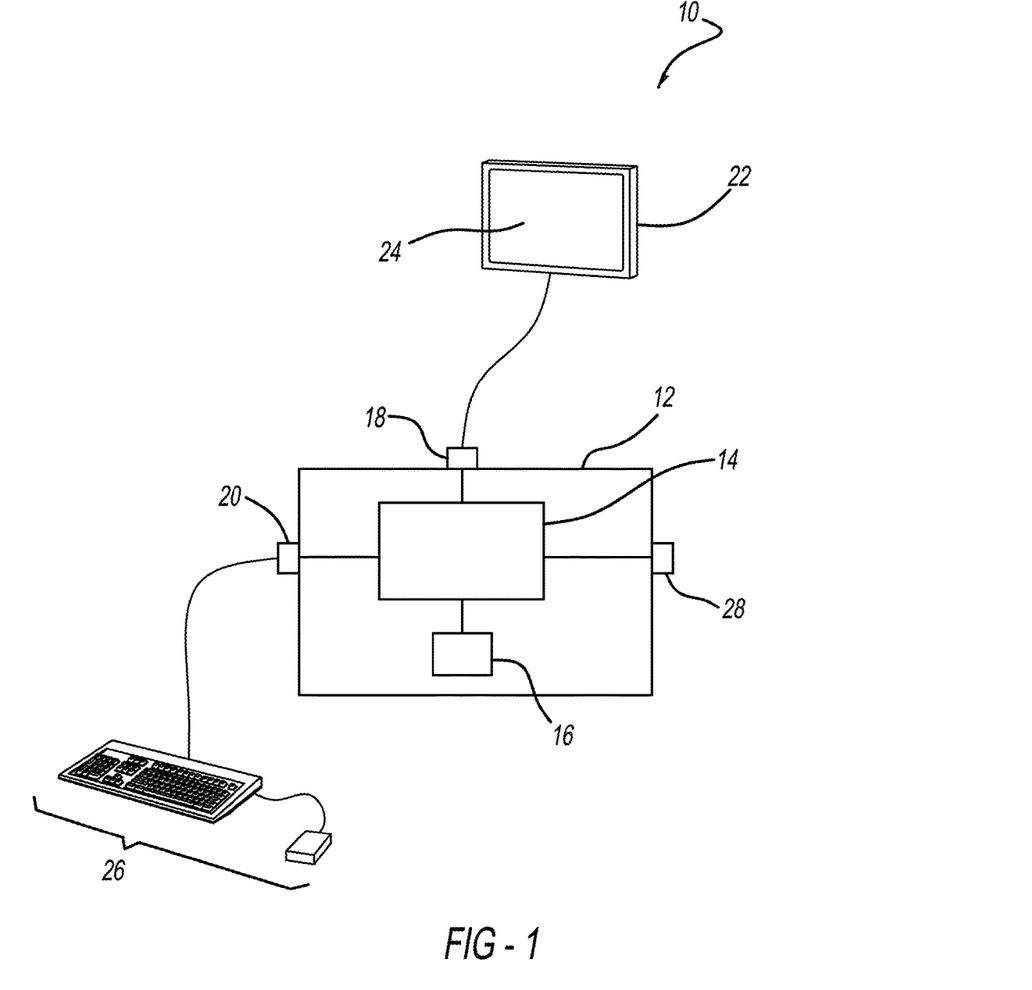
FIG. 1 illustrates a vehicle simulation system.

Referring now to FIG. 1, a vehicle simulation system 10 is shown. The vehicle simulation system 10 includes a simulator device 12 having a processor 14 and a computer readable medium 16. The processor 14 is in communication with the computer readable medium 16. The simulator device 12 may be a dedicated device for preforming vehicle simulations but may also be embodied on a general purpose computer.

The computer readable medium 16 may be one of any one of a number of different computer readable mediums. For example, the computer readable medium 16 may be a solid state memory device, but any other type of computer readable medium, such as magnetic or optical computer readable medium may be utilized. Additionally, it should be understood that the computer readable medium 16 may be integrated into the processor 14. The computer readable medium 16 may include instructions for instructing the processor 14 to perform any one of a number of different tasks.

The computer readable medium 16 may include a database associated with the computing device and includes multiple vehicle profiles. Individual multiple vehicle profiles may include a plurality of engine control units or Electronic Control Units (ECU). The plurality of ECU's are configured to simulate a plurality of Parameter ID's (PIDs) and corresponding response codes.

The processor 14 is in communication with an output device port 18 and an input device port 20. The output device port 18 may be connected to an output device 22 such as a monitor having a display area 24. The input device port 20 may be connected to any one of a number of different input devices but generally may be connected to a keyboard and/or mouse type device for providing information to the simulator device 12.

A vehicle inspection tool may be connected to a vehicle inspection tool port 28, which is also in communication with the processor 14. The processor 14 is configured to perform a vehicle simulation for auditing a vehicle inspection tool connected to the port 28. The instructions located within the computer readable medium 16 configure the processor 14 to allow individual multiple vehicle profiles to be independently selectable via the input device 26 for providing at least one PID response code to the vehicle inspection tool.

Essentially, the simulator device 12 allows an emission testing device to be tested by using the vehicle simulator tool to mimic a number of different ECU's commonly found on a variety of different vehicles. Additionally, the vehicle simulator device 12 is able to mimic a number of PIDs and corresponding response codes so as to test the emissions testing device across a wide array of different ECU's and PIDs and response codes. By so doing, the simulator device 12 essentially acts as a single tool that is able to fully test an emissions testing device connected to the port 28.

Further, the port 28 may be configured to communicate with a vehicle diagnostics port, such as an OBD-II port. The processor 14 is configured to query and monitor a vehicle via the vehicle diagnostics port and further configure to create and store new vehicle profiles corresponding to the monitored vehicle in the medium 16.

As stated previously, the processor 14 is configured to perform a variety of different simulations. For example, the processor 14 is configured to simulate a plurality of different ECU's simultaneously. Additionally, the processor 14 is also configured to simulate a variety of different PID's at an adjustable interval. The adjustable interval may be a simultaneous simulation or could also include a sequential simulation. Further, the adjustable interval could correspond to a predetermined "within specification" interval or even "outside a specification" interval. Finally, the adjustable interval may be such that it could be adjusted independently.

The processor 14 is further configured to include a PID that does not exist in a vehicle corresponding to the vehicle profile or that is not automatically detectable in a vehicle corresponding to at least one vehicle profile. Since there is significant ability to adjust and test across a variety of different PID's, the processor 14 may display on the display device 22 an adjustable knob to allow an adjustable interval to be utilized for easily adjusting the delay of the at least one PID response code.

Additionally, since a variety of different ECU's may be tested at once, the simulator may also be able to provide testing for a first ECU which is configured to respond with a valid PID response code and a second ECU which is configured to respond with an invalid response code. Further, the separate ECU's may be displayed in different areas of a display as will be described in greater detail later.

The processor 14 may also be further configured to allow at least one of the multiple vehicle profiles stored in the database to be adjustable. The plurality of different PID's can be determined from a variety of different techniques such as random, cyclical, statically and can also be independently suppressible. The vehicle simulator device 12 may also be configured to provide and test for a variety of different diagnostic trouble codes stored within the database. For example, a variety of different diagnostic trouble codes can be configured and applied to the simulation.

Figure 2:
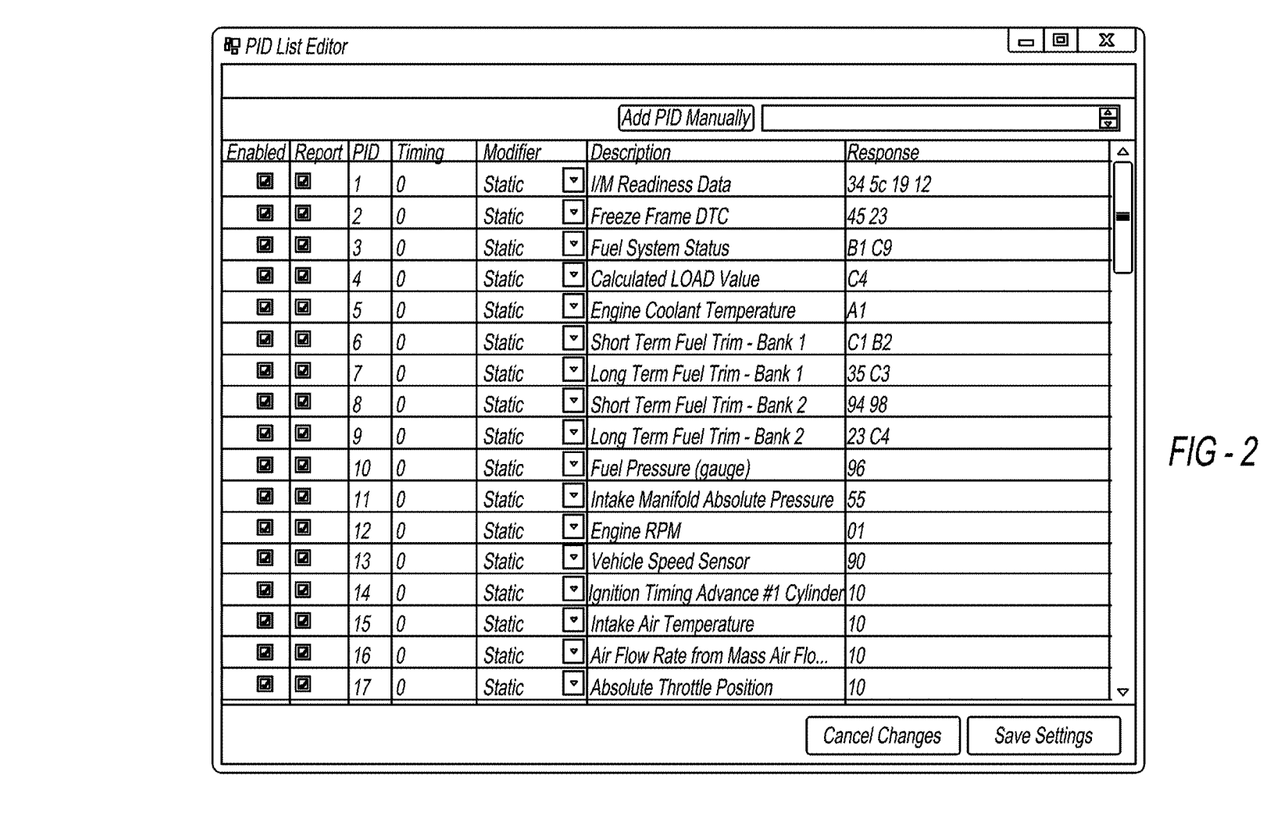
FIG. 2 illustrates a screenshot of the vehicle simulator for responses on a per PID basis.
Figure 3:
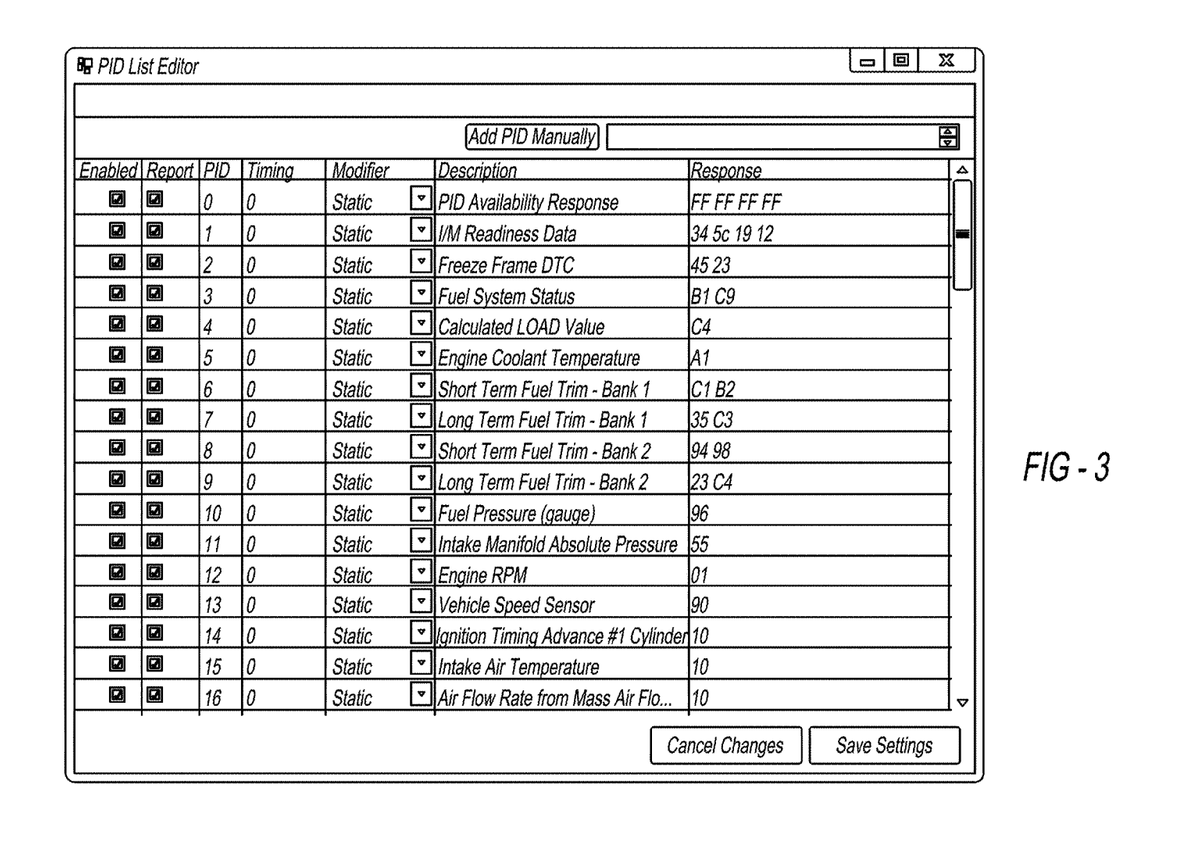
FIG. 3 illustrates a screenshot of the vehicle simulator that allows for detection of PIDs even when they do not exist.

As stated before, the display device 22 has a display area 24, to allow for the displaying of information regarding the simulation. For example, referring to FIG. 2, a screenshot is shown that illustrates the vehicle simulator to allow for the adjustment of the timing, within specification and it even exceeding specification for responses on a per PID basis. FIG. 3 illustrates a similar screenshot, however, in this screenshot, the vehicle simulator allows for detection of PID's when in fact they may not exist. Complementary to what was described in FIG. 2, the response from PID's not automatically detectable but are still present is possible.

Figure 4:
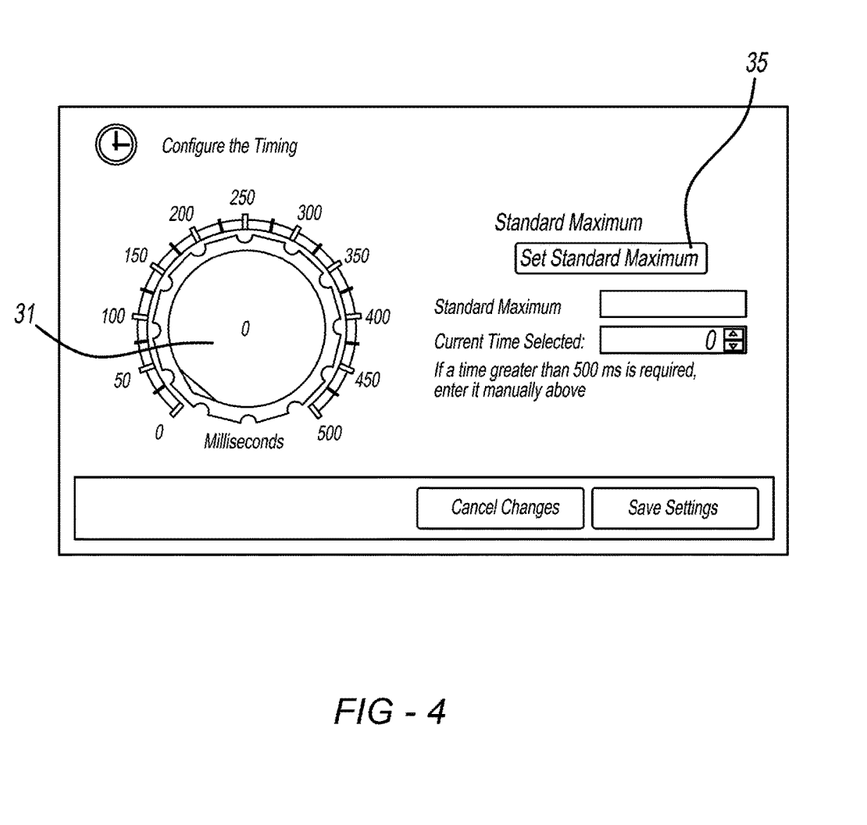
FIG. 4 illustrates a screenshot of the vehicle simulator that allows adjustment of a timing via an electronic knob for easily adjusting the delay of a response.

FIG. 4 illustrates a screenshot displayed in the display area 24 that allows the changing of timing. Here, the screenshot shown in the display are 24 includes a knob 31 that allows the easy adjustment of the delay of the response. Further, a standard maximum can be set by simply clicking button 35 using the input devices 26 of FIG. 1.

Figure 5:
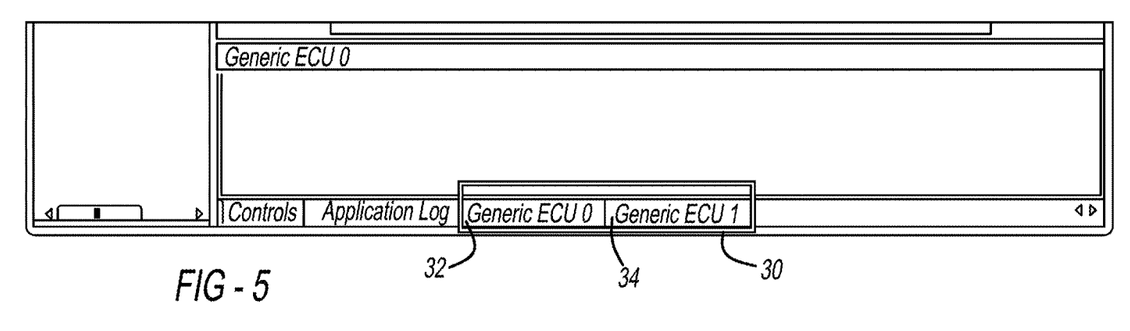
FIG. 5 illustrates a portion of a screenshot of the vehicle simulator that separates communication by ECU and displays the traffic and communication in segregated areas for easy viewing.

Referring to FIG. 5, as discussed previously, the vehicle simulator allows separate simulated ECU's to respond with a different valid or invalid PID values. As shown in FIG. 5, box 30 shows a first ECU selection area 32 and a second ECU selection are 34. By using the input device 26 of FIG. 1, different ECU's can be selected to display different information in segregated areas for easy viewing.

Figure 6:
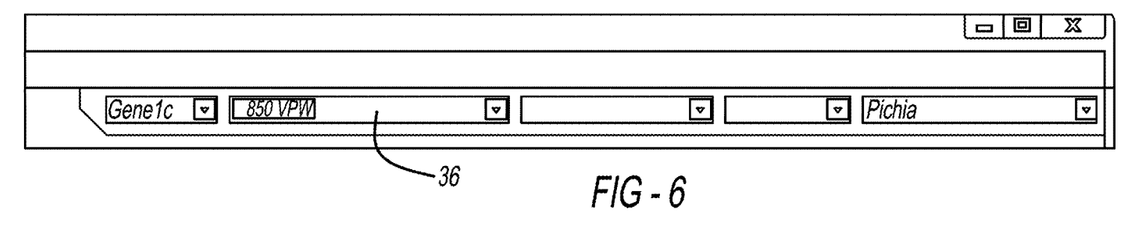
FIG. 6 illustrates a portion of a screenshot of a vehicle simulator that adjusts to existing profiles in a stored database.
Figure 7:
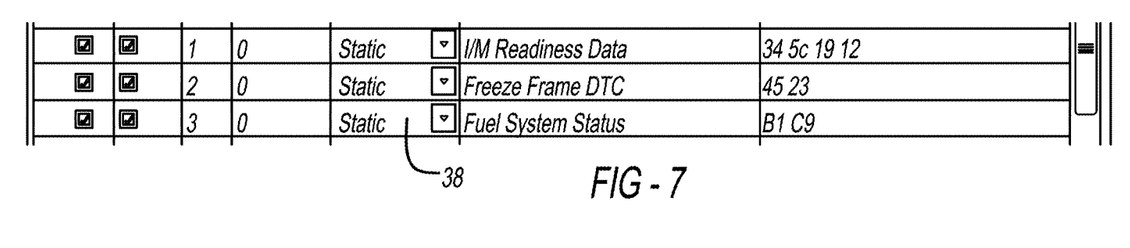
FIG. 7 illustrates a portion of a screenshot of a vehicle simulator that allows responses set by different types.

Referring to FIG. 6, different databases to existing profiles can be easily selected through a dropdown box 36. As shown in FIG. 7, the vehicle simulator allows responses to be set by different times through dropdown box 38 across a variety of different systems. As stated before, the responses may be set as random, cyclic, or static for different response profiles.

Figure 8:
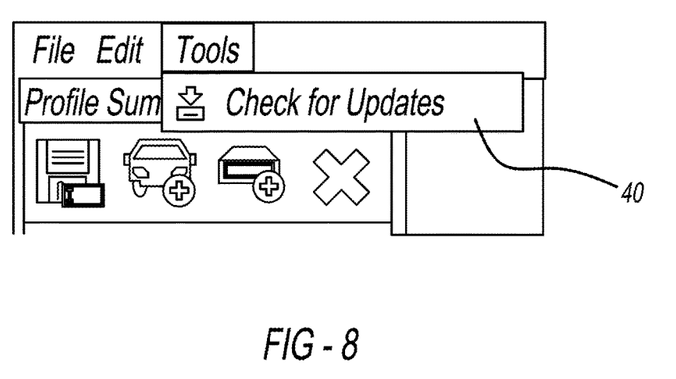
FIG. 8 illustrates a portion of a screenshot that shows that the software for the vehicle simulation is updatable via an online connection.
Figure 9:
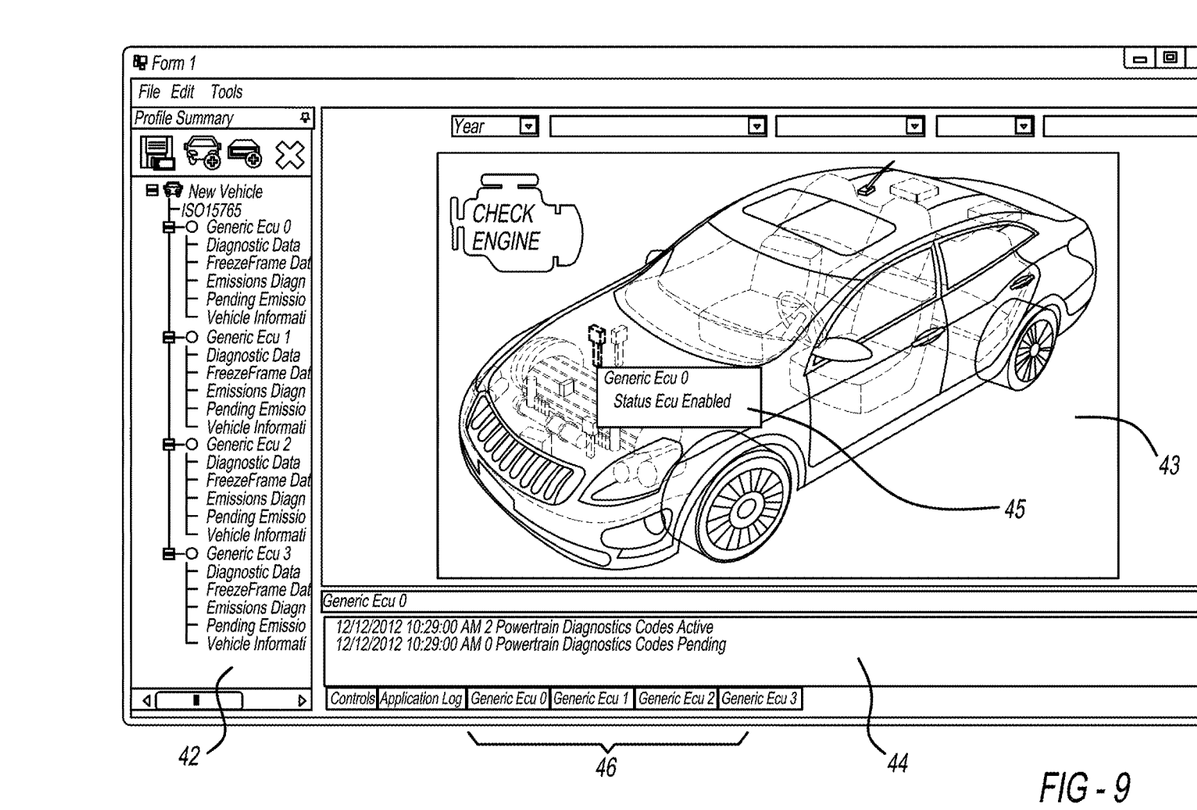
FIG. 9 illustrates a screenshot of a vehicle simulator that allows for suppression of separate modes when communicating with the vehicle and displays the vehicle and an ECU inside of the vehicle.

Referring to FIG. 8, a screenshot is illustrated showing that the device 12 can be easily updated by clicking on a check for updates button 40 using the input device 26. Referring to FIG. 9, FIG. 9 illustrates a screenshot having a first area 42, a second area 43 and a third area 44. The first area allows for the selection or suppression of separate modes when communication with the vehicle. The second area 43 illustrates a picture of the vehicle and the ECU inside of it with communication in cues 45. The third area 44 shows which codes are active or pending. Near the bottom of the screenshot of FIG. 9, tabs for selecting different ECU's 46 are also shown to allow one to switch between different ECU's to display relevant information regarding those different ECU's.

Figure 10:
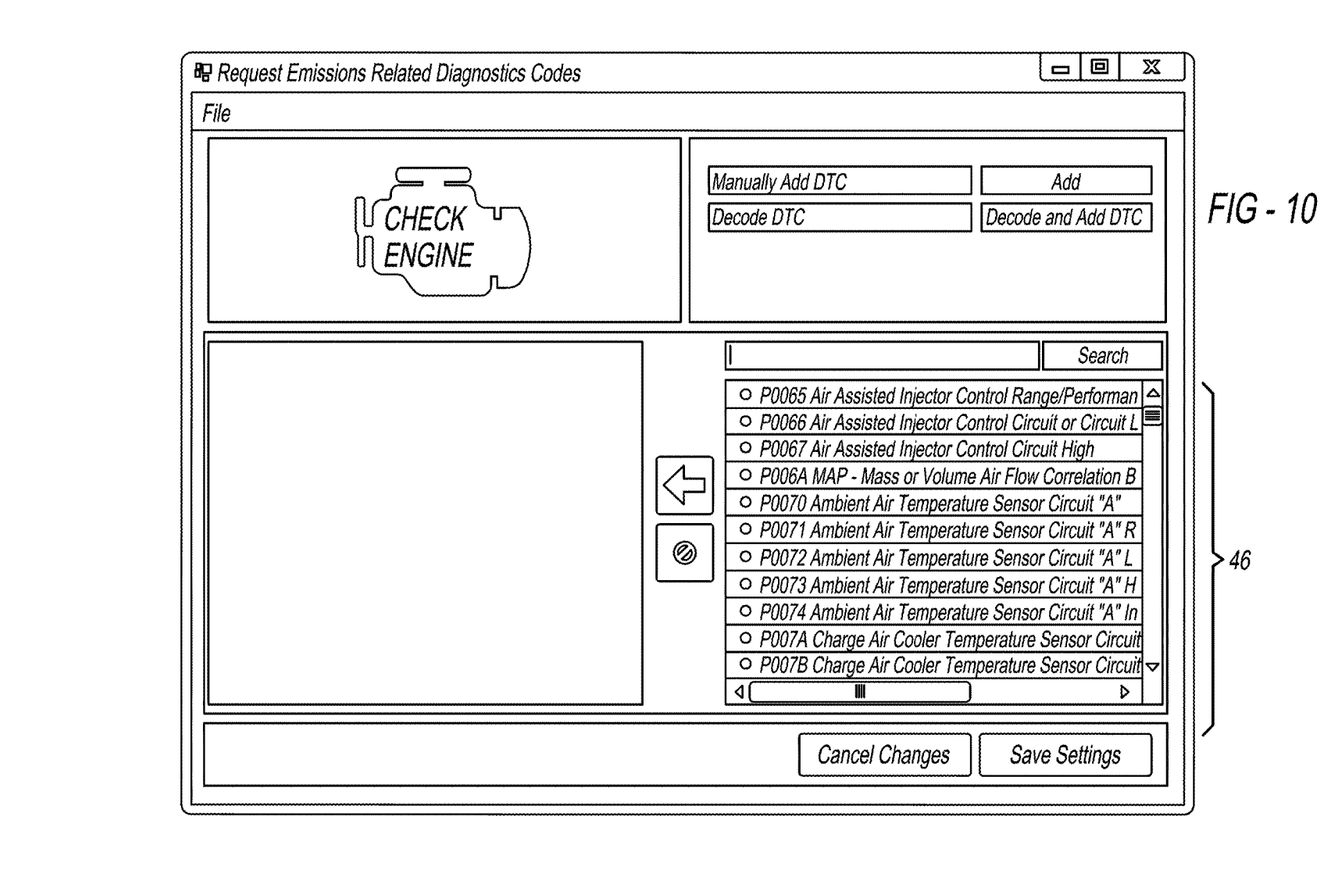
FIG. 10 illustrates a screenshot of a vehicle simulator with diagnostic trouble code stored internally inside the application database.

FIG. 10 illustrates a screenshot to be displayed in the display area 24 to display device 22 which allows different diagnostic trouble codes 46 to be selected. Essentially, a user can use the input device 26 to select different diagnostic codes 46 to test if these diagnostic codes are being detected.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

The invention claimed is:

1. A vehicle simulation system comprising:
   a simulator device including a computing device having a computer processor and a computer readable medium, the simulator device further including a communication port configured for communicating with an emissions inspection tool;

a database associated with the computing device and including multiple vehicle profiles, wherein each of the multiple vehicle profiles include a plurality of Electronic Control Units (ECUs), and wherein each of the plurality of ECUs are configured to simulate a plurality of Parameter IDs (PIDs) and corresponding response codes; and wherein each of the multiple vehicle profiles are independently selectable for providing at least one PID response code to the emissions inspection tool;

wherein the computing device is configured to perform a vehicle simulation for auditing the emissions inspection tool.

2. The system of claim 1 further comprising a vehicle port configured for communicating with a vehicle diagnostics port.

3. The system of claim 2, wherein the system is configured to query and monitor a vehicle via the vehicle diagnostics port and further configured to create and store a new vehicle profile corresponding to the monitored vehicle.

4. The system of claim 1, wherein the system is configured to simulate a plurality of ECUs simultaneously.

5. The system of claim 1, wherein the system is configured to simulate a plurality of PIDs at an adjustable interval.

6. The system of claim 5, wherein the adjustable interval comprises a simultaneous simulation.

7. The system of claim 5, wherein the adjustable interval comprises a sequential simulation.

8. The system of claim 5, wherein the adjustable interval corresponds to a predetermined "within specification" interval.

9. The system of claim 5, wherein the adjustable interval corresponds to a predetermined "outside of specification" interval.

10. The system of claim 5, wherein the adjustable interval of individual ones of the plurality of PIDs are independently adjustable.

11. The system of claim 5, wherein the adjustable interval is adjustable via a knob for easily adjusting the delay of at least one PID response code.

12. The system of claim 1, wherein at least one vehicle profile includes a PID that does not exist in a vehicle corresponding to the at least one vehicle profile.

13. The system of claim 1, wherein at least vehicle profile includes a PID that is not automatically detectable in a vehicle corresponding to the at least one vehicle profile.

14. The system of claim 1, wherein a first ECU is configured to respond with a valid PID response code and a second ECU is configured to respond with an invalid PID response code.

15. The system of claim 1, wherein the system is configured to provide a display signal.

16. The system of claim 15, wherein the display signal includes a first display corresponding to a first ECU and a second display corresponding to a second ECU.

17. The system of claim 15, wherein the display signal includes a display of the vehicle corresponding to the vehicle profile, the ECU being simulated, and an icon corresponding to the PID response being simulated.

18. The system of claim 1, wherein at least one of the multiple vehicle profiles stored in the database is adjustable.

19. The system of claim 1, wherein individual ones of the plurality of PIDs are corresponding response codes are randomly determined.

20. The system of claim 1, wherein individual ones of the plurality of PIDs are corresponding response codes are cyclically determined.

21. The system of claim 1, wherein individual ones of the plurality of PIDs are corresponding response codes are statically predetermined.

22. The system of claim 1, wherein individual ones of the plurality of PIDs are independently suppressible.

23. The system of claim 1, further comprising one or more diagnostic trouble codes (DTCs) stored within the database.

24. The system of claim 23, wherein at least one of the DTCs is configured to be applied to the simulation.

* * * * *